US006646326B1

United States Patent
Kim et al.

(10) Patent No.: US 6,646,326 B1
(45) Date of Patent: Nov. 11, 2003

(54) METHOD AND SYSTEM FOR PROVIDING SOURCE/DRAIN-GATE SPATIAL OVERLAP ENGINEERING FOR LOW-POWER DEVICES

(75) Inventors: Hyeon-Seag Kim, San Jose, CA (US); Jongwook Kye, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 127 days.

(21) Appl. No.: 09/714,361

(22) Filed: Nov. 15, 2000

(51) Int. Cl.$^7$ ............................................. H01L 29/06
(52) U.S. Cl. ....................... 257/623; 257/344
(58) Field of Search ................... 257/344, 388, 257/314, 330, 623

(56) References Cited

U.S. PATENT DOCUMENTS

| 5,633,519 A | * | 5/1997 | Yamazaki et al. | 257/315 |
| 5,766,988 A | * | 6/1998 | Cho et al. | 438/159 |
| 6,054,385 A | * | 4/2000 | Gardner et al. | 438/655 |
| 6,197,645 B1 | * | 3/2001 | Michael et al. | 438/300 |

OTHER PUBLICATIONS

Yang, N., et al., "A Comparative Study of Gate Direct Tunneling and Drain Leakage Currents in N–MOSFET's with Sub–2–nm Gate Oxides," IEEE Transactions on Electronic Devices, vol. 47, No. 8, Aug. 2000, pp. 1636–1644.

* cited by examiner

Primary Examiner—Richard Elms
Assistant Examiner—Brad Smith
(74) Attorney, Agent, or Firm—Winstead Sechrest & Minick P.C.

(57) ABSTRACT

A method and system for providing a semiconductor device on a substrate are disclosed. The method and system include providing a tunneling barrier on the substrate and providing at least one gate on the tunneling barrier. The at least one of gate includes a first edge, a second edge and a base. The method and system further include providing a source and/or a drain for the at least one gate. The source and/or a drain are in proximity to the first edge or the first and second edges of the at least one gate. The at least one gate, the source and/or drain or both the at least one gate and the source and/or drain are configured such that source and/or drain do not substantially overlap the at least one gate at the base of the at least one gate.

15 Claims, 16 Drawing Sheets

METHOD AND SYSTEM FOR PROVIDING SOURCE/DRAIN-GATE SPATIAL OVERLAP ENGINEERING FOR LOW-POWER DEVICES

FIELD OF THE INVENTION

The present invention relates to semiconductor devices, and more particularly to a method and system for controlling the spatial overlap between the source or drain and the gate.

BACKGROUND OF THE INVENTION

A conventional semiconductor device typically includes a number of cells, each having a source, a drain, and at least one gate. FIG. 1 depicts such a conventional semiconductor device 10. The semiconductor device 10 includes a substrate 11. The semiconductor device includes conventional cells 15 and 17. The conventional cells 15 and 17 include conventional gates 20 and 26, which are separated from the semiconductor substrate 11 by a tunneling barrier 13. Although only a single conventional gate 20 and 26 is shown for each conventional cell 15 and 17, respectively, each conventional cell 15 and 17 may have multiple conventional gates in a gate stack. The conventional gates 20 and 26 are typically formed of polysilicon. Also depicted in FIG. 1 are conventional sources 12 and 16 and a conventional drain 14. As depicted in FIG. 1, the conventional sources 12 and 16 and the conventional drain 14 each has a particular shape. The conventional sources 12 and 16 extend under and have a spatial overlap with the gates 20 and 26, respectively. Similarly, the conventional drain 14 extends under and has a spatial overlap with the conventional gates 20 and 26.

FIG. 2A depicts a conventional method 50 for forming the conventional semiconductor device 10. The method 50 depicted in FIG. 2A will be described in conjunction with FIGS. 2B–2D. Referring to the FIGS. 2A–2D, the tunneling barrier 13 is provided, via step 52. The timing barrier 13 is typically a very thin insulator, often less than 100 Angstroms. In addition, the tunneling barrier 13 may be made of a nitride. Currently, either NO or $N_2O$ are often used. The conventional gates 20 and 26 are then provided, via step 54. Step 54 typically includes providing a layer of polysilicon and then defining the conventional gates from the layer of polysilicon. The conventional gates are typically 1500–3000 Angstroms in thickness. FIG. 2B depicts the conventional semiconductor device 10 after the conventional gates 20 and 26 have been defined. An optional halo implant is then typically provided, via step 56. The halo implant typically utilizes the dopants having the same conductivity type as the channel and, therefore, the underlying substrate. Thus, the halo implant has conductivity type as the opposite of the source 12 or 16 and the drain 14. The halo implant is typically provided a high angle, so that will be under the gate and between the source and the drain for a particular memory cell. This angle is depicted by the direction of the arrows in FIG. 2B.

A first conventional source and drain implant, for the extensions of the source and drain, is provided, via step 58. The implant is typically and LDD implant. In some conventional methods 50 the dopant used in step 58 is phosphorus. Also step 58, the first conventional source and drain implant is driven to ensure that the input extends over the desired area. However, typically the step drives the first source and drain implant under the gates. For example, FIG. 2C depicts the conventional semiconductor device 10 after the step 58 has been completed. The portions of the sources 12 and 16 and the portion of the drain 14 formed by the conventional first source and drain implant are depicted by areas 12A, 14A, and 16A. These areas 12A, 14A and 16A are shallow and extend under the conventional gates 20 and 26. Thus, the portions of the areas 12A, 14A and 16A that extend under the gates 20 and 26 are typically called the source extensions and drain extensions.

After the first conventional source and drain implants are provided and driven in step 58, conventional spacers are provided, via step 60. The conventional spacers 22, 24, 26 and 30 are typically on the order of five hundred to one thousand Angstroms in width. After the conventional spacers are provided in step 60, a conventional source and drain implant is provided, via step 62. The conventional source and drain implant provided in step 62 is typically arsenic and use the provided direction perpendicular to the surface of the conventional semiconductor device 10. Because of the presence of the conventional spacers 22, 24, 26 and 30, the dopant for conventional source and drain implants provided in step 62 is spaced apart from the gates 20 and 26 by the width of the spacers 22, 24, 26 and 30. In other words, the dopant for the conventional source and drain implant typically starts out five hundred to one thousand Angstroms away from the conventional gates 20 and 26. Thus, once the dopant for the conventional source and drain implant provided in step 62 is thermally cycled, the dopant is not driven under the conventional gates 20 and 26. FIG. 2D depicts the conventional semiconductor device 10 after step 62 has been formed. The conventional sources 12 and 16 are depicted as having portions 12A and 12B and portions 16A and 16B, respectively. Similarly, the drain 14 is depicted as having portions 14A and 14B. The portions 12B, 14B and 16B are formed in the conventional source and drain implant performed in step 62. Thus, the portions 12B, 14B and 16B are provided after formation of the conventional spacers 22, 24, 28 and 30. As a result, the portions 12B and 14B and the portions 14B and 16B do not extend under the edges of the conventional gates 20 and 26, respectively.

Although the method 50 can be used provided conventional semiconductor device 10, one of ordinary skill in the art will readily realize that there several drawbacks to the conventional semiconductor device 10 so formed. The conventional sources 12 and 16 and the conventional drain 14 extend under the conventional gates 20 and 26. In particular, the extensions of the portions 12A and 14A and the portions 14A and 16A extend under the conventional gates 20 and 26, respectively. In general, the portions 12A, 14A and 16A extend under each of the conventional gates 20 and 26 by approximately eighty to one hundred Angstroms. This spatial overlap between the gates 20 and 26 and the source 12 and 16, respectively, and between the gates 20 and 26 and drain 14 causes several problems.

The spatial overlap between the sources 12 and 16 or the drain 14 in the gates 20 and 26 causes a increased power dissipation by the conventional cells 15 and 17. A leakage current during the off state of the cells 15 and 17 is proportional to the area of spatial overlap between the gates 20 and 26 and the sources 12 and 16 or the drain 14. This leakage current is due to the tunneling of charge carriers between the portions of the conventional sources 12 and 16 under the conventional gates 20 and 26 (i.e. the source and drain extensions) and conventional gates 20 and 26 and to tunneling between the portions of the conventional drain 14 under the conventional gates 20 and 26 the conventional gates 20 and 26. The leakage current is particularly high for low bias devices. The leakage current can drastically increase the power consumed by the conventional semiconductor device 10, which is undesirable.

The spatial overlap between the conventional sources of 12 and 16 and the conventional gates 20 and 26 and between the conventional drain 14 from the conventional gates 20 and 26 can also adversely affect the tunneling barrier 13. Hot carrier injection at the overlap of the source 12 or 16 and the gate 20 or 26 or at the overlap of the drain 14 and the gate 20 or 26 causes stress in the tunnel barrier 13. Consequently, the portion of the barrier 13 above the overlaps can be degraded.

The overlap between the conventional sources 12 and 16, the conventional drain 14 and the conventional gates 20 and 26 can also introduced an additional delay. The spatial overlap regions are capacitive regions. In other words, the conventional gates 20 and 26 are conductive. In addition, the conventional sources 12 and 16 and the conventional drain 14 are conductive. As a result, in the overlap region there are two conductors (the gate 20 and 26 and the source 12 and 16 or the gate 20 and 26 and drain 14) separated by an insulator, the tunneling barrier 13. Consequently, capacitances exist in the overlap regions. These capacitances can introduce an RC delay in the conventional semiconductor device 10. Typically, a high speed is a desired characteristic in semiconductor devices. Consequently, such a delay is undesirable. In addition to the above-mentioned issues, the spatial overlap regions allow for increased band to band tunneling in the gate into stood leakage current.

Furthermore, there may also be and other drawback to the conventional semiconductor device 10. Typically, a high field exists at the corners of the gates 20 and 26. In general, electric fields tended concentrate near sharp corners. When NO or $N_2O$ are used for the tunneling barrier 13, the polysilicon gates 12 and 16 have sharp corners because oxidation does not substantially round the corners of the gates 20 and 26 in the presence of the NO or $N_2O$ tunneling barriers 13. The high fields concentrated at the corners of the gates 20 and 26 tends to degrade the structure and, therefore, the performance of the conventional semiconductor device 10.

Accordingly, what is needed is a system and method for improving the performance of semiconductor devices, particularly reducing source and drain leakage current. The present invention addresses such a need.

SUMMARY OF THE INVENTION

The present invention provides a method and system for providing a semiconductor device on a substrate. The method and system comprise providing a tunneling barrier on the substrate and providing at least one gate on the tunneling barrier. The at least one of gate includes a first edge, a second edge and a base. The method and system further comprise providing a source and/or a drain for the at least one gate. The source and/or a drain are in proximity to the first edge or the first and second edges of the at least one gate. The at least one gate, the source and/or drain or both the at least one gate and the source and/or drain are specially configured such that source and/or drain do not substantially overlap the at least one gate at the base of the at least one gate.

According to the system and method disclosed herein, the present invention reduces the leakage current from the source and/or drain when the power is off. In addition, the present invention may reduce the capacitive delay, the gate induced leakage current, and the band to the band tunneling, and damage due to hot carrier injection.

DETAILED DESCRIPTION OF THE INVENTION

The present invention relates to an improvement in semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a semiconductor device on a substrate. The method and system comprise providing a tunneling barrier on the substrate and providing at least one gate on the tunneling barrier. The at least one of gate includes a first edge, a second edge and a base. The method and system further comprise providing a source and/or a drain for the at least one gate. The source and/or a drain are in proximity to the first edge or the first and second edges of the at least one gate. The at least one gate, the source and/or drain or both the at least one gate and the source and/or drain are specially configured such that source and/or drain do not substantially overlap the at least one gate at the base of the at least one gate.

The present invention will be described in terms of particular methods and materials used. However, one of ordinary skill in the art will readily recognize that this method and system will operate effectively for other materials and other steps for fabrication consistent with the present invention. In addition, one of ordinary skill in the art will readily realize that the purposes of clarity, steps have been omitted in discussing methods in accordance with the present invention. Furthermore, although the present invention is described in the context of specially engineering the source and/or drain or specially engineering the gate, any combination of the above is consistent with the present invention. In addition, the present invention is described in the context of bulk devices, such as FETs, that are fabricated on the semiconductor substrate. However, the present invention is consistent with other devices.

Figure 3:
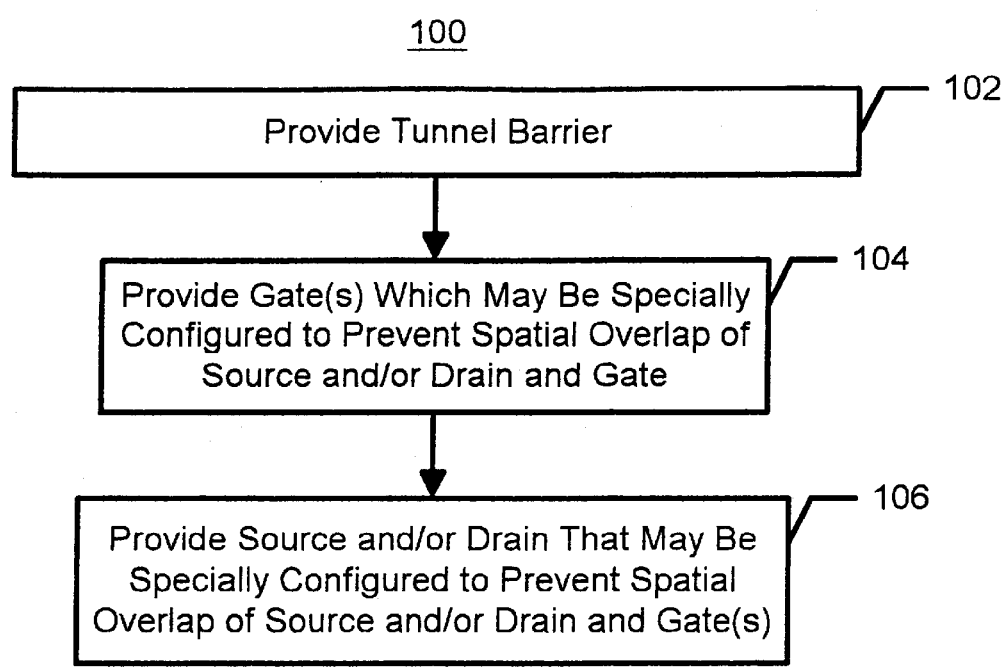
FIG. 3 is a high level flow chart of one embodiment of a method in accordance with the present invention.

To more particularly illustrate the method and system in accordance with the present invention, refer now to FIG. 3, depicting a high level flow chart of one embodiment of a method 100 in accordance with the present invention. The method 100 is preferably used to provide bulk devices, such as FETs formed directly on the bulk semiconductor substrate. However, the method 100 can be used to proved other devices, such as silicon oxide insulator devices, which are formed on a silicon layer on top of an oxide layer on a bulk silicon substrate. The tunneling barrier is provided, via step 102. The tunneling barrier is an insulator. For example, in one embodiment the tunneling barrier includes NO or $N_2O$. The tunneling barrier is also 10, often one hundred Angstroms or less in thickness. The gates for the cells of the semiconductor device are then provided, via step 104. Step 104 preferably includes a forming one or more polysilicon layers. If there is more than one gate per cell, then the polysilicon layers for different gates in a single cell are preferably separated by insulators. The gates are also defined in the polysilicon layers in step 104, preferably by masking portions of polysilicon layers which will become the gates and etching the remaining portions of polysilicon layers. The gates are provided on the tunneling barrier and are generally between five hundred and one thousand Angstroms thick. The sources and/or drains for the cells are provided, via step 106. The gates are specially provided in step 104 and/or the sources and/or drains specially are provided in step 106 such that the sources and/or drains do not extend under the bases of the gates. For example, the gates might be configured differently from conventional gates in step 104 or the sources and/or drains provided in step 106 may be configured differently from conventional sources and/or drains. Fabrication of the semiconductor device can then be completed in a conventional manner.

Figure 4A:
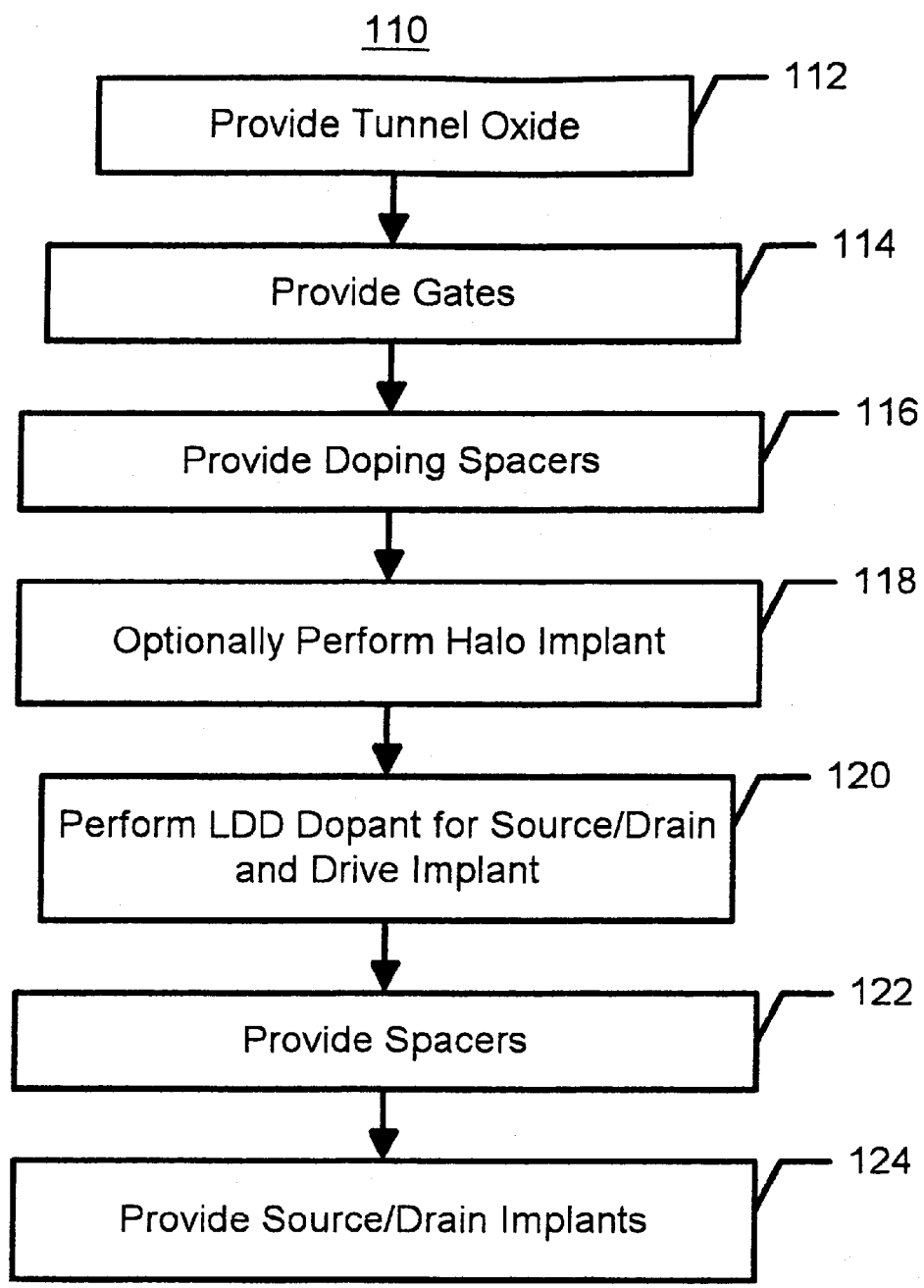
FIG. 4A is a more detailed flow chart of one embodiment of a method in accordance with the present invention.
Figure 4B:
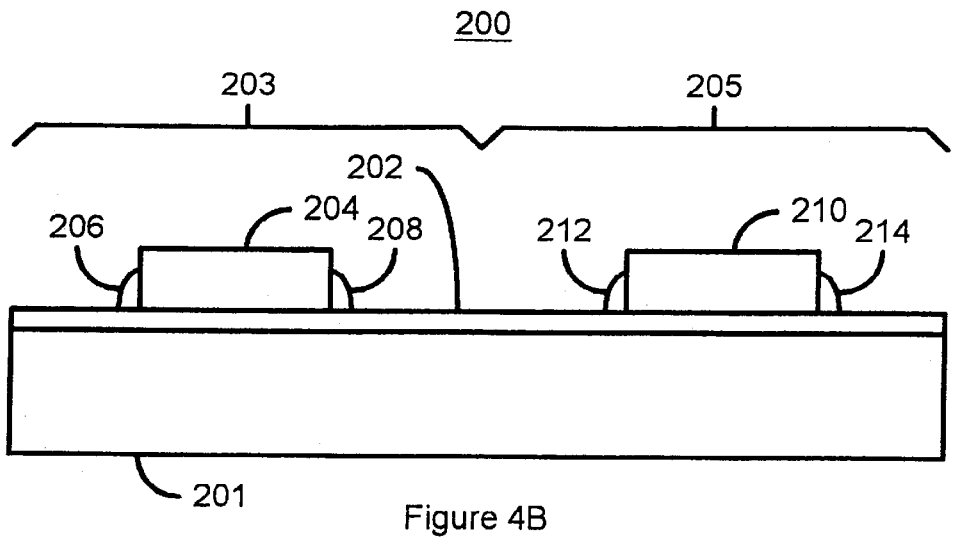
FIGS. 4B–4D depict one embodiment of the semiconductor device in accordance with the present invention.
Figure 4C:
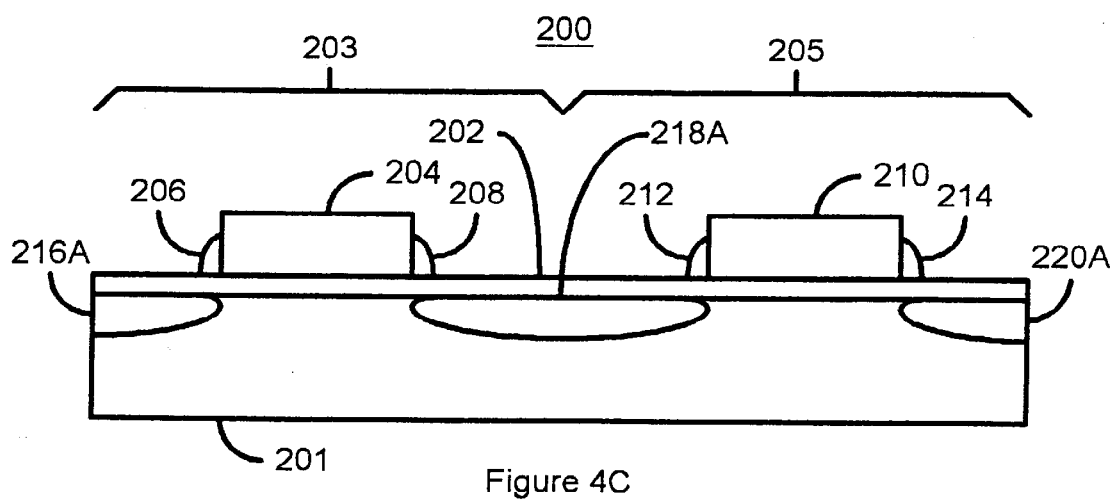
Figure 4D:
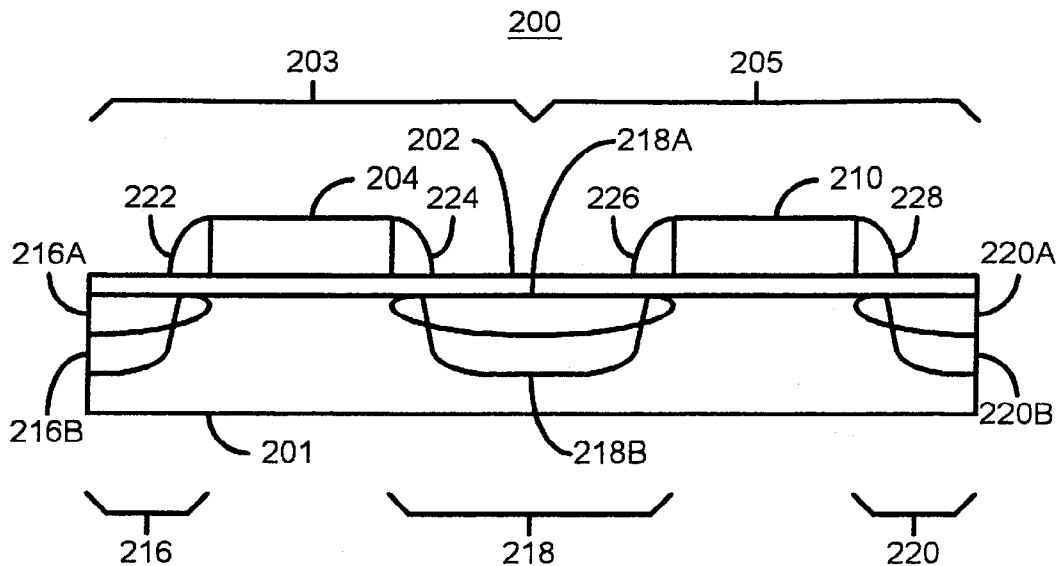

FIG. 4A depicts a more detailed flow chart of one method 110 for providing a semiconductor device in accordance with the present invention. The semiconductor device is preferably a bulk device, such as a FET formed on the bulk semiconductor. However, in another embodiment, the semiconductor device could be another device, such as an SOI device. In addition, FIGS. 4B–4D depict a semiconductor memory device 200 in accordance with the present invention at various points to fabrication using the method 110. Referring to FIGS. 4A–4D, a tunneling barrier is provided, via step 112. The tunneling barrier is a thin insulator, often approximately one hundred Angstroms or less in thickness. In one embodiment, the tunneling barrier includes NO or $N_2O$. At least one gate is provided for each of the cells in the semiconductor device, via step 114. In one embodiment, step 114 includes depositing one or more polysilicon layers, the polysilicon layers for separate cells being separated by insulators, providing a layer a photoresist on the polysilicon layers, transferring a pattern to the photoresist layer and etching the polysilicon layers using the pattern to define gates for different cells.

Doping spacers are then provided, via step 116. The doping spacers are preferably provided on both sides of each gate, for the source and the drain. However, in another embodiment, the doping spacers could be used in either the source or the drain, but not both. The doping spacers are preferably wide enough to prevent dopants for the source and/or drain from extending under the gates.

FIG. 4B depicts one embodiment of the semiconductor device 200 in accordance the present invention after the step 116 has been completed. The semiconductor device 200 includes a tunneling barrier 202 on a semiconductor substrate 201. The semiconductor device 20 includes gates 204 and 210 for cells 203 and 205. Doping spacers 206 and 208 are at the sides of the gate 204. Doping spacers 212 and 214 are the sides of the gate 210. The doping spacers 206, 208, 212 and 214 each have a width which is sufficient to ensure that the sources and drains do not extend under the gates 204 and 210. In one embodiment, the doping spacers 206, 208, 212 and 214 have a width of approximately eighty to one hundred Angstroms. Such a width is sufficient to ensure that the extensions of the source and drain, discussed below, do not substantially extend under the gates 204 and 210. Consequently, the doping spacers 206, 208, 212 and 214 can insure that there is little or no spatial overlap between the gates 204 and 210 and the source and/or drain (not shown).

Referring back to FIG. 4A, an optional halo implants may then be provided, via step 118. The dopant for halo implant preferably has the same conductivity type as the channel in underlying semiconductor substrate 201, under the gates 204 and 210. The halo implant is preferably provided at a high angle so that the halo implant will be at the edges of the source and/or drain. A first source and/or drain implant is provided, via step 120. The first source and/or drain implant is preferably an LDD implant having a conductivity type that is different from the semiconductor. Step 120 also preferably includes driving the dopant for the first source and/or drain implant. Step 120 is performed after the doping spacers have been provided in step 116. The first source and/or drain implant provided in step 120 is, therefore, spaced farther from the gates 204 and 210.

FIG. 4C depicts the semiconductor device 200 after step 120 has been performed. The first source and/or drain implant has resulted in source regions 216A and 220A as well as drain region 218A, all of which preferably are relatively shallow. The regions 216A and 220A are the source extensions, while the region 218A is the drain extension. Because the first source and/or drain implant provided in step 120 is performed after the doping spacers 206, 208, 212 and 214 are provided, the source regions 216A and 220A as well as the drain region 218A did not substantially extend under the gates 204 and 210. Consequently, there is little or substantially no overlap between the source regions 216A and 220A and the gates 204 and 210 or between the drain region 218A and the gates 204 and 210.

Figure 1:
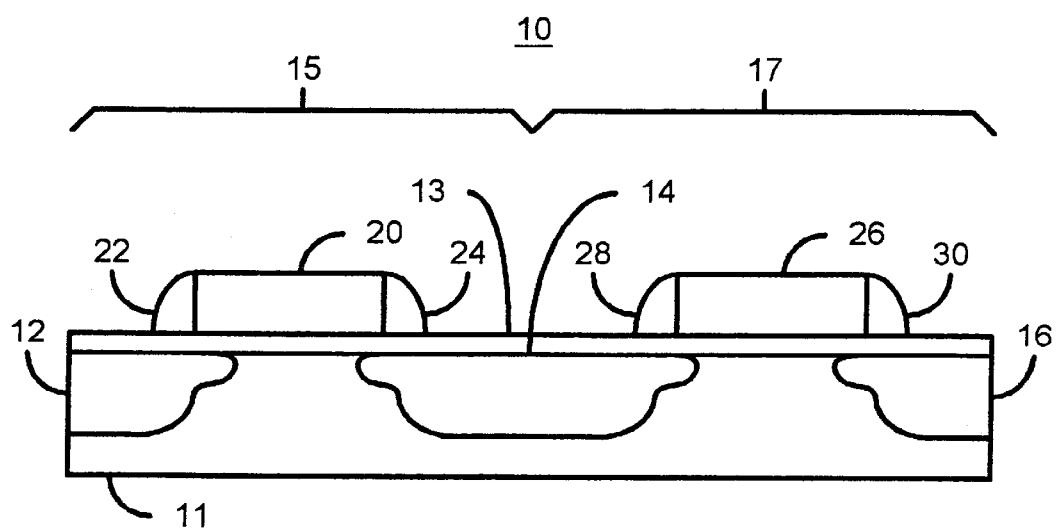
FIG. 1 is a block diagram of a conventional semiconductor device.
Figure 2A:
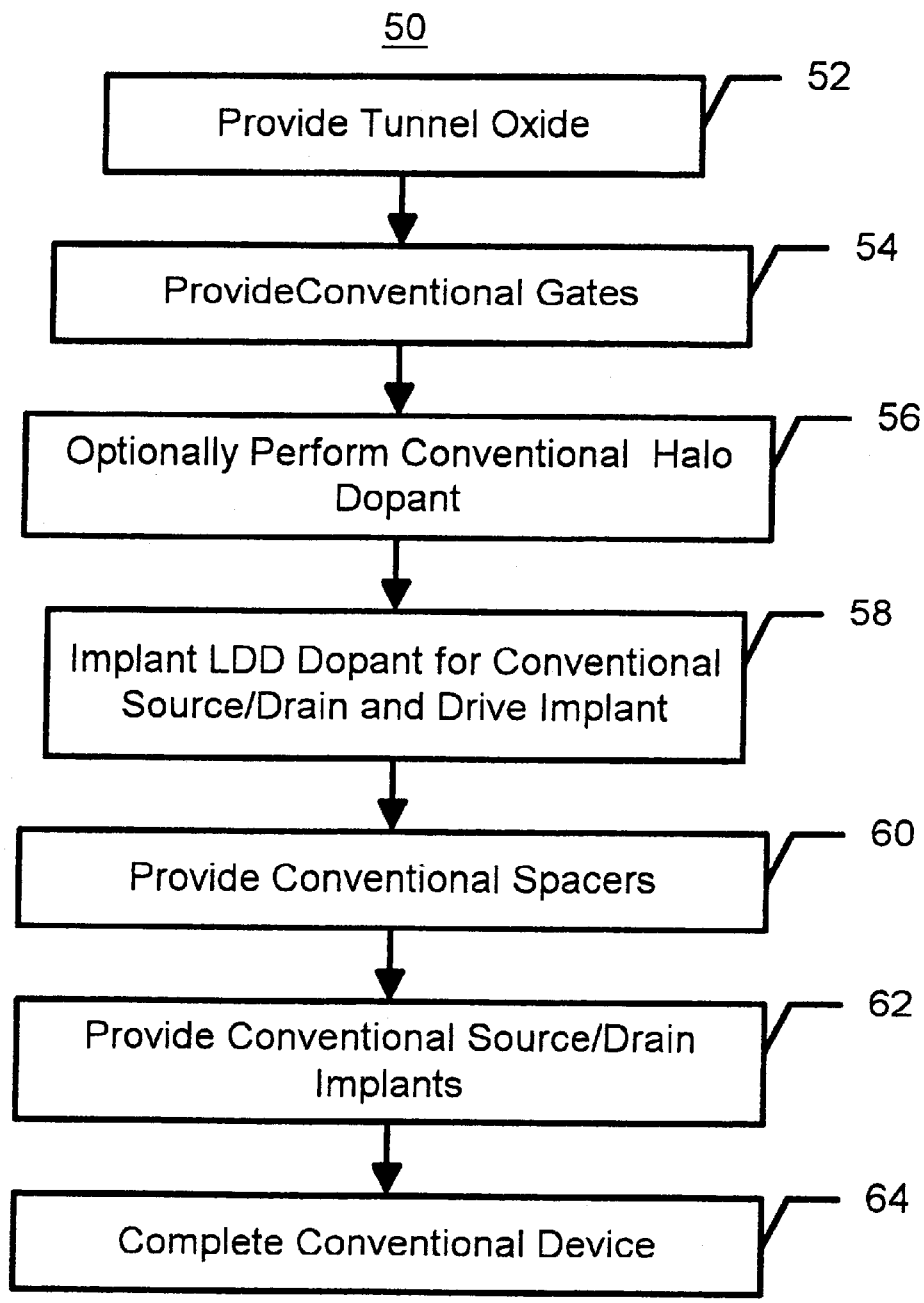
FIG. 2A is a flow chart depicting a conventional method for providing a conventional semiconductor device.
Figure 2B:
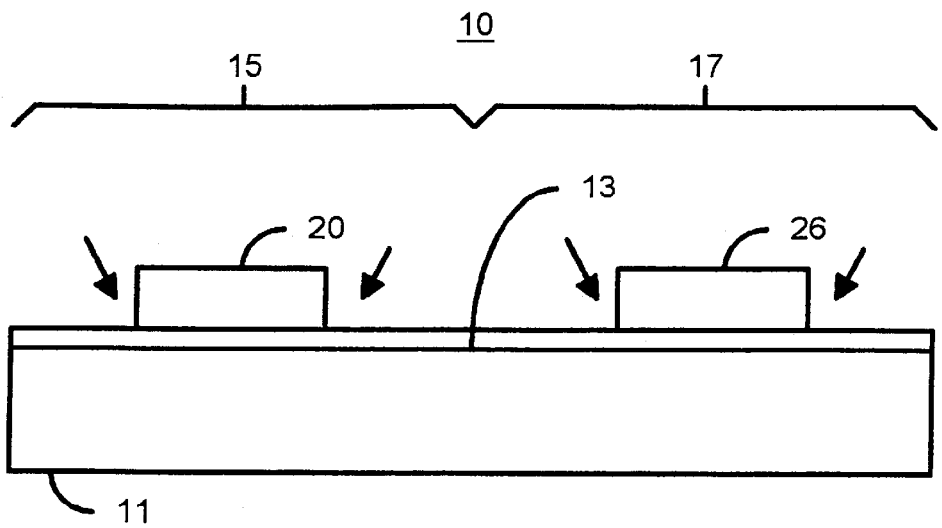
FIGS. 2B–2C depicted conventional style to the memory device during fabrication.
Figure 2C:
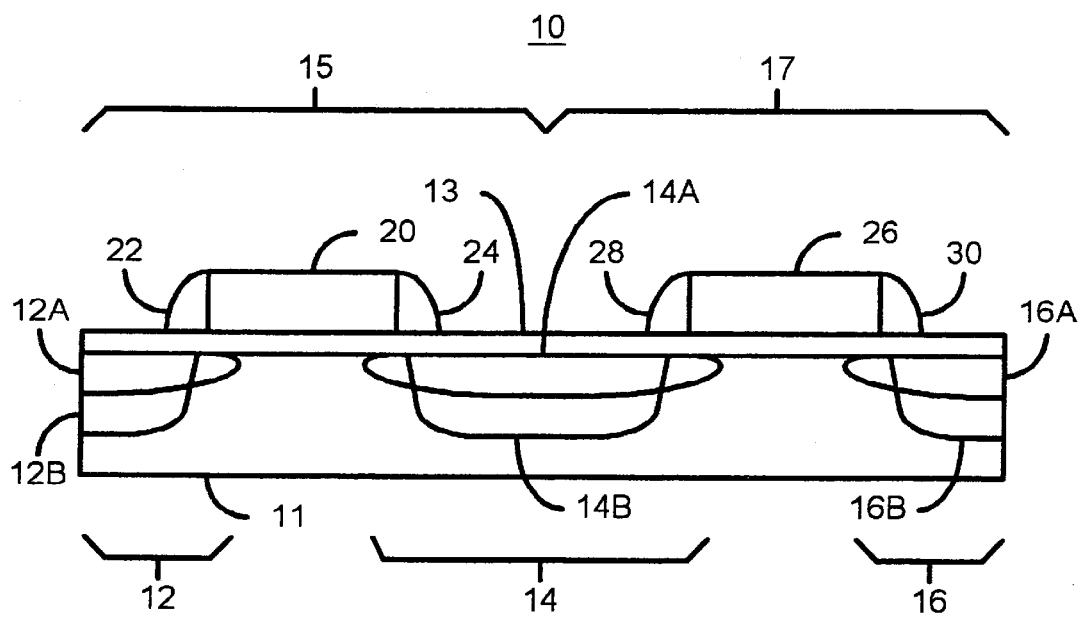

Referring back to FIG. 4A, spacers are provided, via step 122. The spacers are analogous to the conventional spacers provided in the conventional semiconductor device depicted in FIG. 1. Therefore, the width of the spacers, as measured from the edges of the gates to the far edge of the spacers, is approximately five hundred to one thousand Angstroms. After the spacers are provided in step 122, the source and/or drain implant is provided, via step 124. The dopant for the source and/or drain implant provided in step 124 is generally arsenic. The dopant provided in step 124 results in portions of the source and/or drain that are deeper than the portions of the source and/or drain provided in the first source and/or drain implant of step 120. Fabrication of the semiconductor device 100 might be continued in a conventional fashion.

FIG. 4D depicts a semiconductor device 200 after step 124 has been performed. The semiconductor device 200 metal also includes spacers 222, 224, 226 and 228. The spacers 222, 224, 226 and 228 are preferably formed on top of the doping spacers 206, 208, 212 and 214 (not explicitly shown), respectively. However, an alternate embodiment, the doping spacers 206, 208, 212 and 214 might be removed prior to formation of the spacers 222, 224, 226 and 228. Thus, the sources 216 and 220 and the include portions 216A and 216B and 220A and 220B, respectively. Similarly, the drain 218 includes portions 218A and 218B. The source regions 216B and 220B as well as drain region 218B are formed by the step 132. Because the portions 216B, 218B, and 220B are formed after the formation of the spacers 222, 224, 226 and 228, the portions 216B, 218B and 220B are spaced farther from the gates 204 and 210. As a result, the portions 216B, 218B and 220B also did not extend under the gates 204 and 210. In addition, as discussed above the portions 216A, 218A and 220A do not extend under the gates 204 and 210 because of the doping spacers 206, 208, 212, and 214. Thus substantially no portion of the drain 218 or the sources 216 and 220 extend under the gates 204 and 210. There is, therefore, substantially no spatial overlap between the drain 218 and gates 204 and 210 and substantially no spatial overlap between sources 216 and 220 and the gates 204 and 210.

Because substantially no spatial overlap between the gates 204 and 210 and the sources 216 and 220 or the drain 218, the power dissipated by the semiconductor device 200 is reduced. As discussed above, a portion of the off-state leakage current is proportional to the spatial overlap between the sources 216 and 220 and/or the drain 218 and the gates 204 and 210. Because there is essentially no spatial overlap between the sources 216 and 220 and the gates 204 and 210 and/or essentially no spatial overlap between the drain 218 and the gates 204 and 210, this off-state leakage current is reduced. As a result, the power dissipated while the semiconductor device 200 is off can be reduced. Furthermore, because there is no spatial overlap, the hot carrier injection stress is reduced. As a result, the tunneling barrier 202 is not degraded due to hot carrier injection. In addition, any RC delay can be reduced. Because there is no spatial overlap between the sources 216 and 220 and the gates 204 and 210 and between the drain 218 and the gates 204 and 210, there is no capacitance due to the overlap. Consequently, there is reduced capacitive delay and improved speed for the semiconductor device 200. In addition, because there is less of a spatial overlap, the band-to-band tunneling and gate induced leakage current are reduced. As a result, performance of the semiconductor device 200 is improved.

Figure 5:
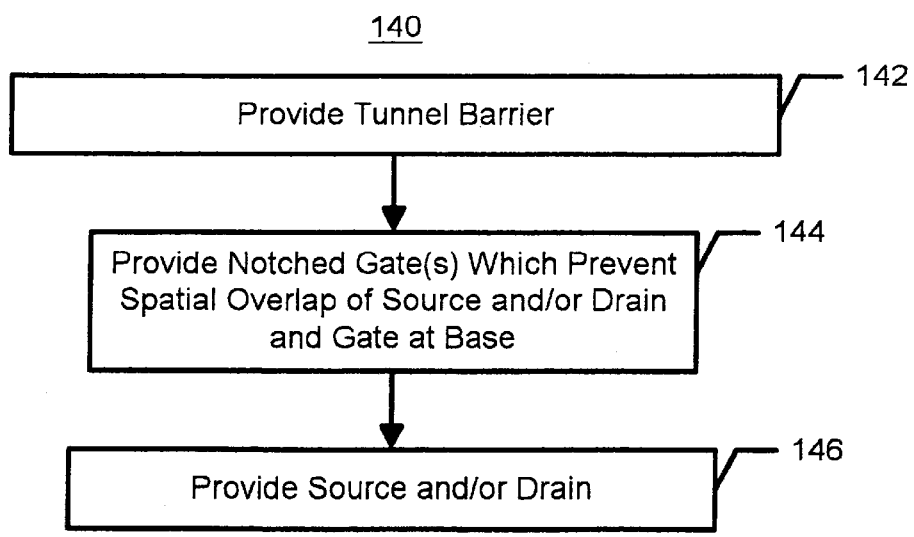
FIG. 5 is a high level flow chart of a second embodiment of a method in accordance with the present invention.

FIG. 5 depicts a high-level flow chart of a second embodiment of a method 140 in accordance with the present invention for providing a semiconductor device. The semiconductor device is preferably a bulk device, such as a FET formed on the bulk semiconductor. However, in another embodiment, the semiconductor device could be another device, such as an SOI device. The tunneling barrier is provided, via step 142. The tunneling barrier is a thin insulator, often approximately one hundred Angstroms or less in thickness. In one embodiment, the tunneling barrier includes NO or $N_2O$. At least one notched gate is provided for each of the cells in the semiconductor device, via step 144. The notched gate has been notched at one or more of the lower corners. The source and drain are provided, via step 146. The notches in the gates are sufficiently wide to ensure that the source and/or drain do not extend under the bases of the gates. In other words, because the base of the gate is smaller, the source and drain do not extend under the gate at its base. Consequently, there will be little or no spatial overlap between the source and the gate and little or no spatial overlap between the drain in the gate.

Figure 6A:
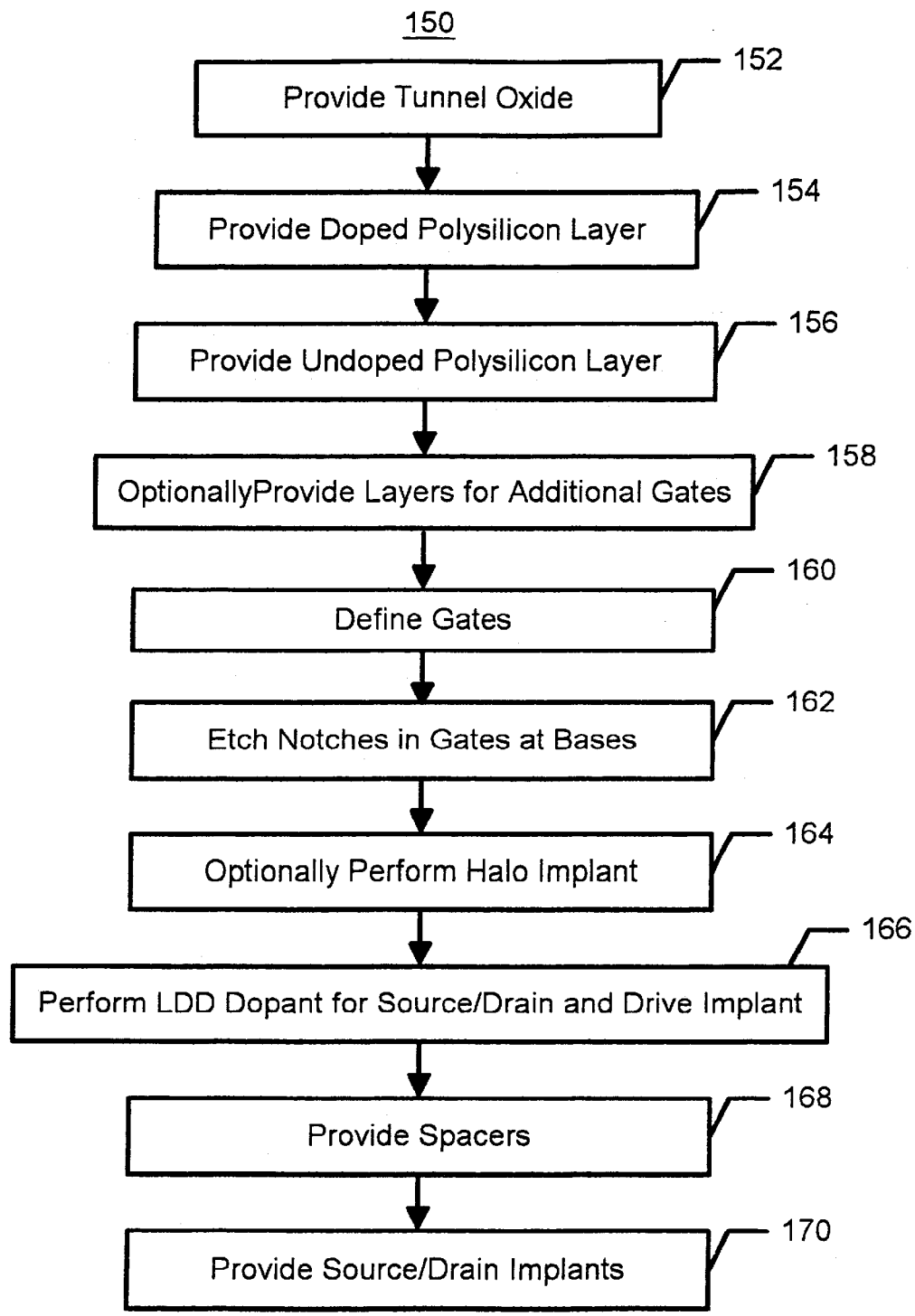
FIG. 6A is a more detailed flow chart of the second embodiment of the method in accordance the present invention.

FIG. 6A depicts a more detailed flow chart of one version of the second embodiment of a method 150 in accordance with the present invention. FIGS. 6B–6E depict a semiconductor device 240 in accordance with the present invention. The semiconductor device is preferably a bulk device, such as a FET formed on the bulk semiconductor. However, in another embodiment, the semiconductor device could be another device, such as an SOI device. The tunneling barrier is provided, via step 152. The tunneling barrier is a thin insulator, often approximately one hundred Angstroms or less in thickness. In one embodiment, the tunneling barrier includes NO or $N_2O$. A layer of doped polysilicon is provided on the tunnel barrier, via step 154. A layer of undoped polysilicon is provided on the doped polysilicon, the step 156. The combination of the undoped polysilicon and the doped polysilicon will form the first gate for the cells in the semiconductor device being fabricated. The layers for subsequent gates, if any, are provided, via step 158. Step 158, if performed for subsequent gates, would include separating gates in a single cell by an insulating layer.

Figure 6B:
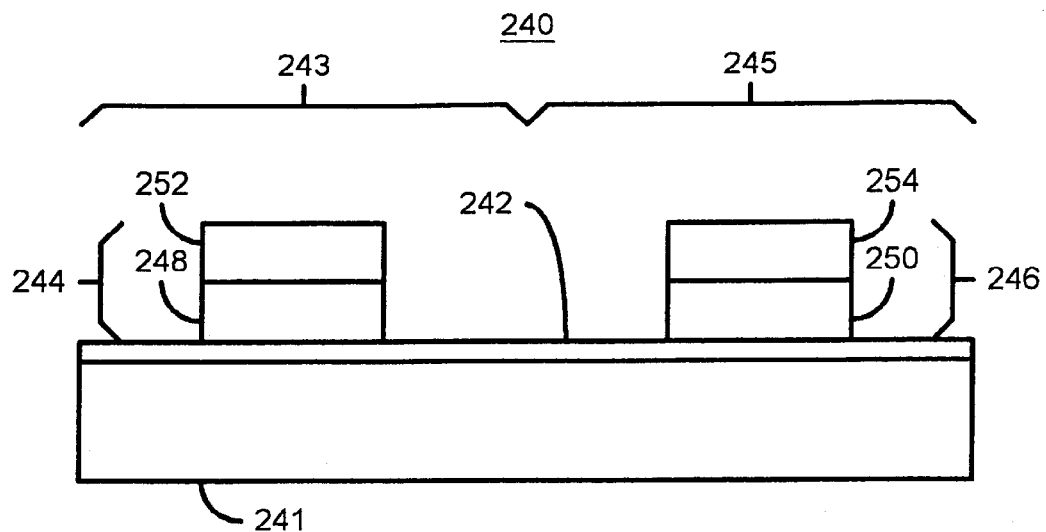
FIGS. 6B–6E depict a second embodiment of the semiconductor device in accordance with the present invention.

The gates for the memory cells are then defined, via step 160. Step 160 generally includes providing a layer photoresist on the semiconductor device, transferring a pattern to the layer photoresist, and etching to be exposed portions of the polysilicon layer(s). FIG. 6B depicts the semiconductor device 240 after step 160 has been performed. The semiconductor device 240 includes a substrate 241 and tunneling barrier 242. The semiconductor device 240 includes cells 243 and 245 having gates 244 and 246. The gates 244 and 246 include doped polysilicon layers 248 and 250, respectively. The gates 244 and 246 also include undoped polysilicon layers 252 and 254, respectively.

Figure 6C:
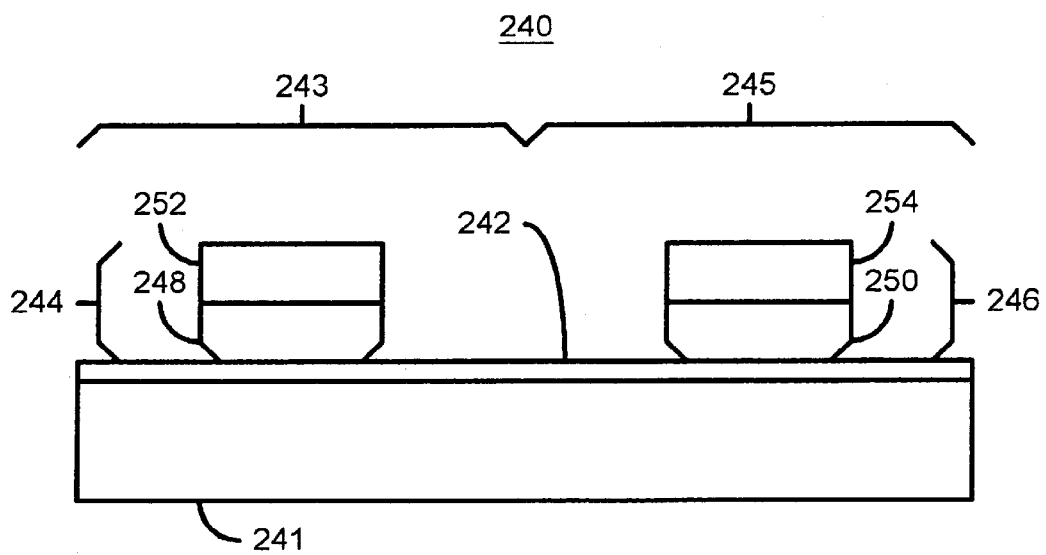

Referring back to FIG. 6A, notches are etched in the lower corners of the gates, via step 162. In a preferred embodiment, the etch performed is an isotropic wet chemical etch. The gates can be notched because doped polysilicon can etch more rapidly than undoped polysilicon. Thus, the etch provided etches the edges of the doped polysilicon layer faster than the undoped polysilicon. Consequently, notches can be formed in the lower corners of the polysilicon layer. FIG. 6C depicts the semiconductor device 240 after step 162 has been performed. As can be seen in FIG. 6C, notches have developed in the lower layer of doped polysilicon 248 and 250 in gates 244 and 246. The bases of the gates 244 and 246 are the portions of the gates 244 and 246 still in contact with the tunneling barrier 242. Because of the notches provided in step 162, the bases of the gates 244 and 246 are smaller than the remainder of the gates 244 and 246.

Figure 6D:
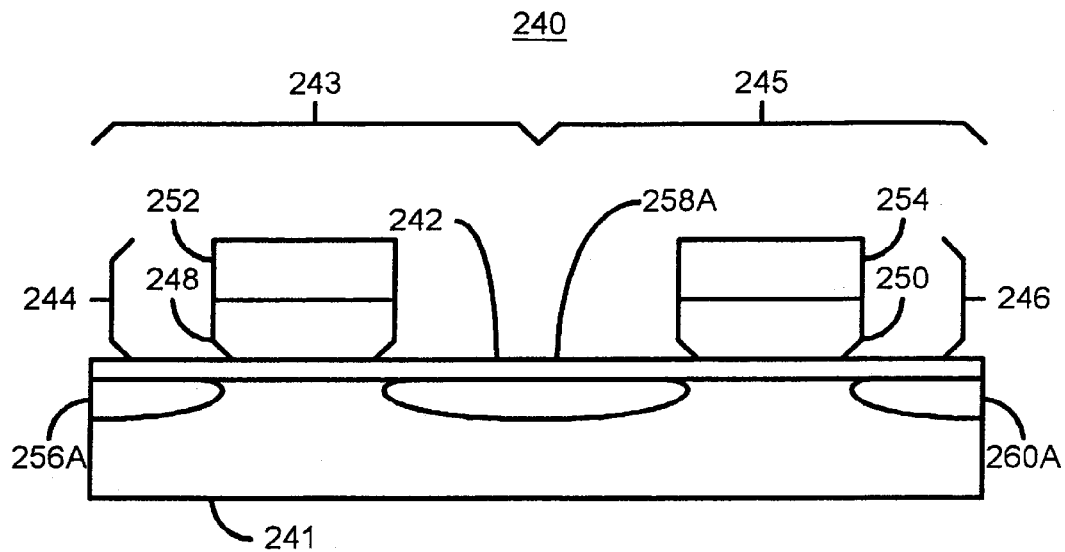

Once the notches are completed, an optional halo implant can be provided, via step 164. The dopant for the halo implant provided in step 164 has the same conductivity type as the channel and, therefore, the opposite conductivity type to the source and drain. A first source and/or drain implant is also provided, via step 166. The first source and/or drain implant is preferably an LDD implant. Step 166 could also include driving the dopant for the first source and/or drain implant. FIG. 6D depicts the semiconductor device 240 after the step 166 has been performed. The semiconductor device 240 includes source regions 256A and 260A and drain region 258A, all of which are preferably relatively shallow. The source regions 256A and 260A and drain region 258A were provided in the step 166. Not depicted are the implants provided by the halo implant step 164. Because the gates 244 and 246 have been notched, the source regions 256A and 260A and the drain region 258A all do not extend under the bases of the gates 244 and 246.

Referring back to FIG. 6A, spacers are provided, via step 168. The spacers provided in step 168 are approximately five hundred to one thousand Angstroms in thickness. Thus, these spacers are analogous to the conventional spacers described in FIGS. 1 and 2A–2C. The source and/or drain implant is then provided, via step 170. The source and/or drain implant provided in step 170 is generally arsenic. The dopant provided in step 170 results in portions of the source and/or drain that are deeper than the portions of the source and/or drain provided in the first source and/or drain implant of step 166. Fabrication of the semiconductor device can then be completed in a conventional manner.

Figure 6E:
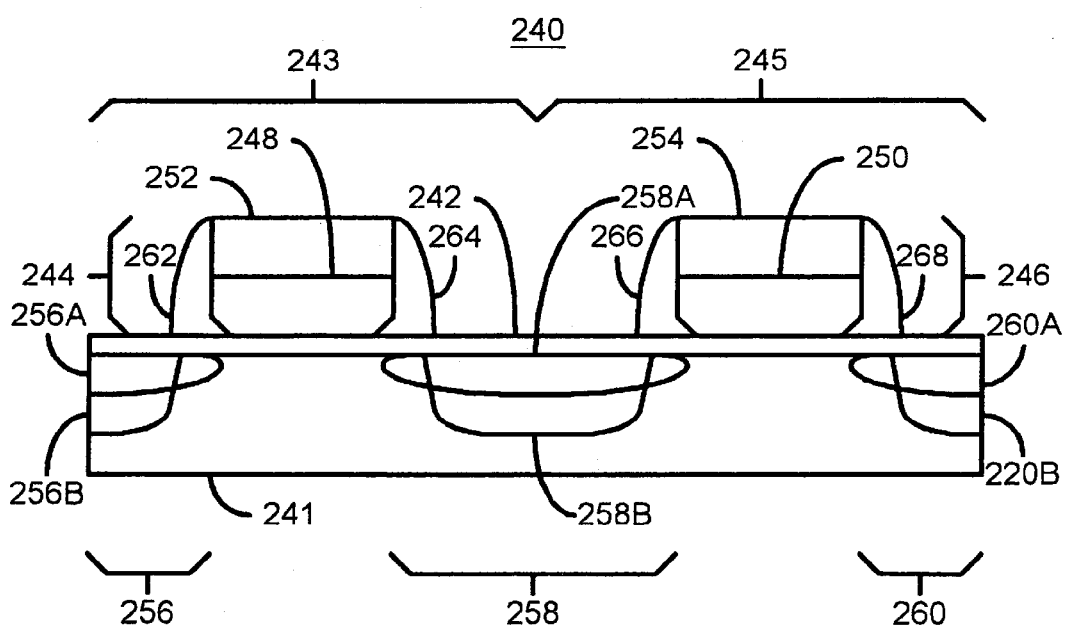

FIG. 6E depicts the semiconductor device 240 after the source and/or drain implant has been performed in step 170. The spacers 262, 264, 266 and 268 have been created. The source regions 256B and 260B, as well as drain region 258B have also been formed. These regions 256B, 258B and 260B are deeper than the extensions 256A, 258A and 260A, respectively. Because of the presence of the spacers 262, 264, 266 and 268, the source regions 256B and 260B and drain region 258B are both far from the edges of the gates 244 and 246. Thus, the notches provided in the gates 244 and 246 ensure that substantially no portion of the sources 256 and 260 substantially no portion of the drain 258 extend under the bases of the gates 244 and 246. There is, therefore, substantially no spatial overlap between the sources 256 and 260 and the bases of the gates 244 and 246 and substantially no spatial overlap between the drain 258 and the bases of the gates 244 and 246.

Because substantially no spatial overlap between the gates 244 and 246 and the sources 256 and 260 or the drain 258, the power dissipated by the semiconductor device 240 is reduced. As discussed above, a portion of the off-state leakage current is proportional to the spatial overlap between the sources 256 and 260 and/or the drain 258 and the gates 244 and 246. Because there is essentially no spatial overlap, this off-state leakage current is reduced. As a result, the power dissipated while the semiconductor device 240 is off can be reduced. Furthermore, because there is no spatial overlap, the hot carrier injection stress is reduced. As a result, the tunneling barrier 232 is not degraded due to hot carrier injection. In addition, any RC delay can be reduced. Because there is no spatial overlap, there is no capacitance due to the overlap. Consequently, there is reduced capacitive delay and improved speed for the semiconductor device 240. In addition, because there is less of a spatial overlap, the band-to-band tunneling and gate induced leakage current are reduced. As a result, performance of the semiconductor device 240 is improved.

Figure 7A:
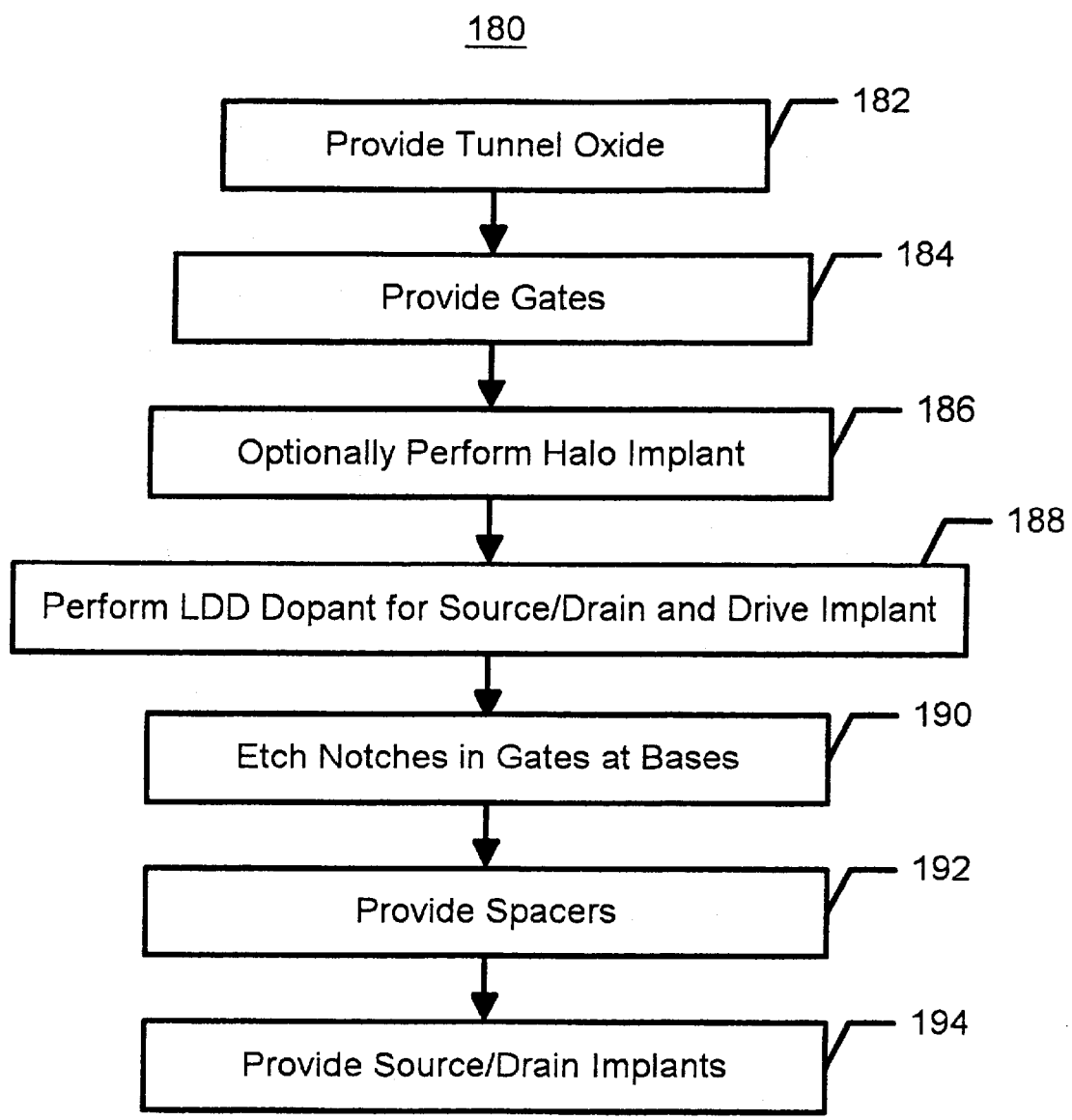
FIG. 7A is another more detailed flow chart of the second embodiment of the method in accordance the present invention.
Figure 7B:
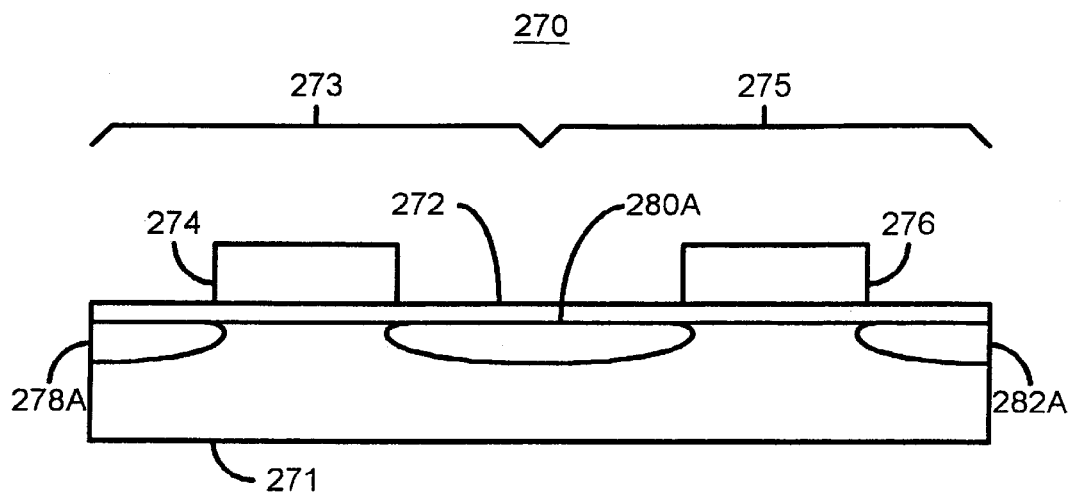
FIGS. 7B–7D depict a third embodiment of the semiconductor device in accordance with the present invention.
Figure 7C:
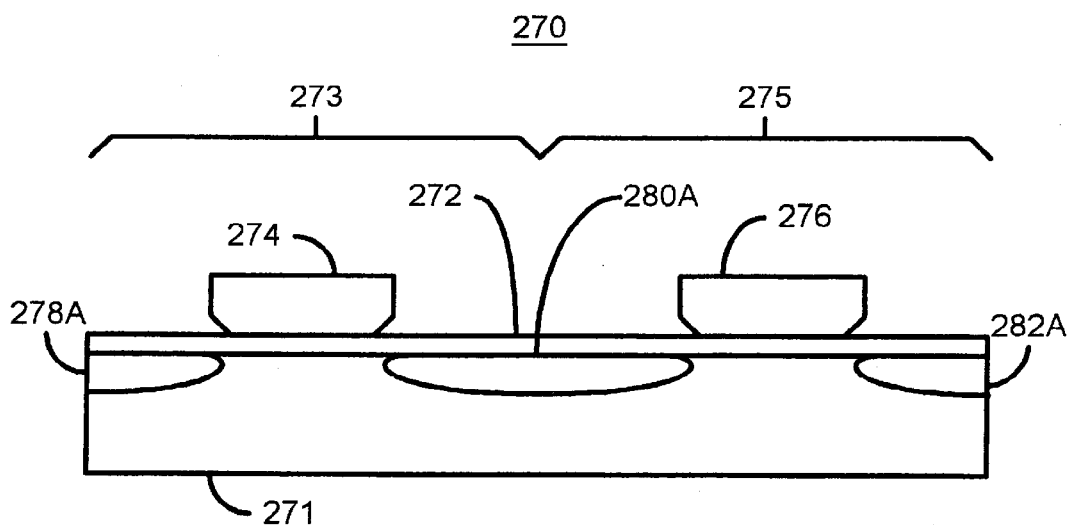
Figure 7D:
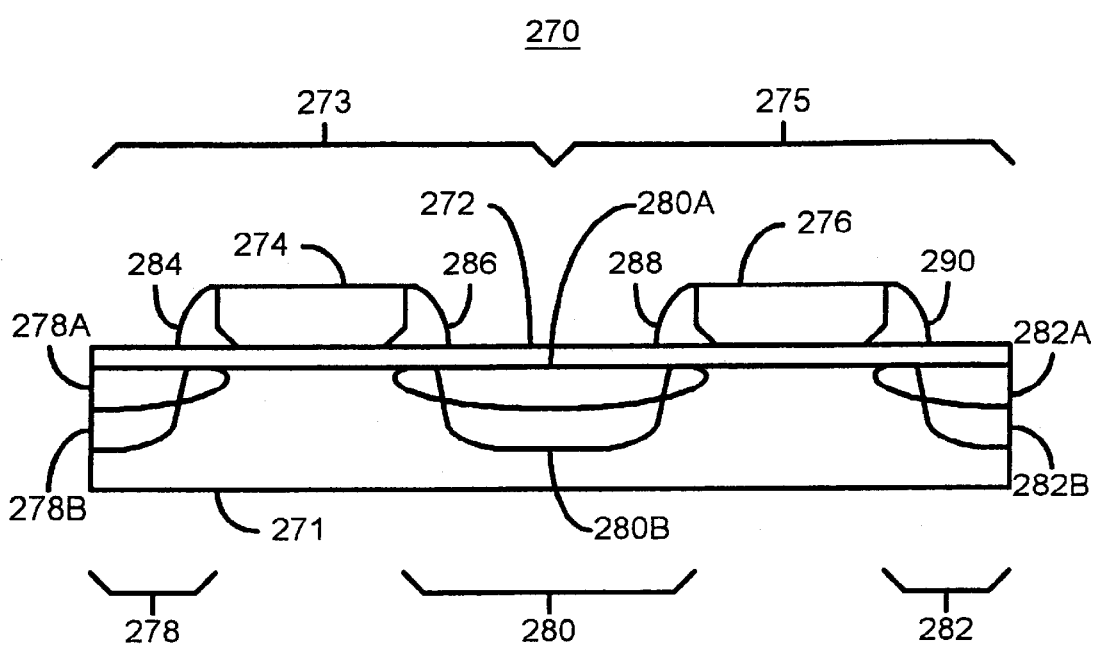

FIG. 7A depicts a more detailed flow chart of a second version of the second embodiment of a method 180 in accordance with the present invention. FIGS. 7B–7D depict a semiconductor device 270 in accordance with the present invention. The semiconductor device is preferably a bulk device, such as a FET formed on the bulk semiconductor. However, in another embodiment, the semiconductor device could be another device, such as an SOI device. The tunneling barrier is provided, via step 182. The tunneling barrier is a thin insulator, often approximately one hundred Angstroms or less in thickness. In one embodiment, the tunneling barrier includes NO or $N_2O$. At least one gate is provided for each of the cells in the semiconductor device, via step 184. In one embodiment, step 114 includes depositing one or more polysilicon layers, the polysilicon layers for separate cells being separated by insulators, providing a layer a photoresist on the polysilicon layers, transferring a pattern to the photoresist layer and etching the polysilicon layers using the pattern to define gates for different cells.

An optional halo implant can be provided, via step 186. The dopant for the halo implant provided in step 186 has the same conductivity type as the channel and, therefore, the opposite conductivity type to the source and drain. The halo implant is generally provided at a high angle from a direction perpendicular to the surface of the semiconductor. A first source and/or drain implant is also provided, via step 188. The first source and/or drain implant is preferably an LDD implant. Step 188 could also include driving the dopant for the first source and/or drain implant.

FIG. 7B depicts the semiconductor device 270 after the step 188 has been performed. The semiconductor device 270 includes a substrate 271 and tunneling barrier 272. The gates 274 and 276 for cells 273 and 275 have been provided. The semiconductor device 270 also includes source regions 278A and 282A and drain region 280A, all of which are preferably relatively shallow. The source regions 278A and 282A and drain region 280A were provided in the step 188. Not depicted are the implants provided by the halo implant step 186.

Referring back to FIG. 7A, notched as are etched in the lower corners of the gates, via step 190. In a preferred embodiment, the etch performed is an isotropic wet chemical etch. The edges of the gates 274 and 276 may be damaged due to the implantation steps 186 and 188. The gates can be notched because doped polysilicon edges can etch more rapidly. Consequently, notches can be formed in the lower corners of the gates. FIG. 7C depicts the semiconductor device 270 after step 190 has been performed. As can be seen in FIG. 7C, notches have developed in the gates 274 and 276. The bases of the gates 274 and 276 are the portions of the gates 274 and 276 still in contact with the tunneling barrier 272. Because of the notches provided in step 190, the bases of the gates 274 and 276 are smaller than the remainder of the gates 274 and 276. Because the gates 274 and 276 have been notched, the source regions 278A and 282A and the drain region 280A all do not extend under the bases of the gates 274 and 276.

Referring back to FIG. 7A, spacers are provided, via step 192. The spacers provided in step 192 are approximately five hundred to one thousand Angstroms in thickness. Thus, these spacers are analogous to the conventional spacers described in FIGS. 1 and 2A–2C. The source and/or drain implant is then provided, via step 194. The source and/or drain implant provided in step 194 is generally arsenic. The dopant provided in step 194 results in portions of the source and/or drain that are deeper than the portions of the source and/or drain provided in the first source and/or drain implant of step 188. Fabrication of the semiconductor device 270 can then be completed in a conventional manner.

FIG. 7D depicts the semiconductor device 270 after the source and/or drain implant has been performed in step 194. The spacers 284, 286, 288 and 290 have been created. The source regions 278B, and 282B, as well as drain region 280B have also been formed. These regions 278B, 280B and 282B are deeper than the extensions 278A, 280A and 282A, respectively. Because of the presence of the spacers 284, 286, 288 and 290, the source regions 278B and 282B and drain region 280B are both far from the edges of the gates 274 and 276. Thus, the notches provided in the gates 274 and 276 ensure that substantially no portion of the sources 278 and 282 substantially no portion of the drain 280 extend under the bases of the gates 274 and 276. There is, therefore, substantially no spatial overlap between the sources 278 and 282 and the bases of the gates 274 and 276 and substantially no spatial overlap between the drain 282 and the bases of the gates 274 and 276.

Because substantially no spatial overlap between the gates 274 and 276 and the sources 278 and 282 or the drain 280, the power dissipated by the semiconductor device 270 is reduced. As discussed above, a portion of the off-state leakage current is proportional to the spatial overlap between the sources 278 and 282 and/or the drain 280 and the gates 274 and 276. Because there is essentially no spatial overlap, this off-state leakage current is reduced. As a result, the power dissipated while the semiconductor device 270 is off can be reduced. Furthermore, because there is no spatial overlap, the hot carrier injection stress is reduced. As a result, the tunneling barrier 272 is not degraded due to hot carrier injection. In addition, any RC delay can be reduced. Because there is no spatial overlap, there is no capacitance due to the overlap. Consequently, there is reduced capacitive delay and improved speed for the semiconductor device 270. In addition, because there is less of a spatial overlap, the band-to-band tunneling and gate induced leakage current are reduced. As a result, performance of the semiconductor device 270 is improved.

Figure 8A:
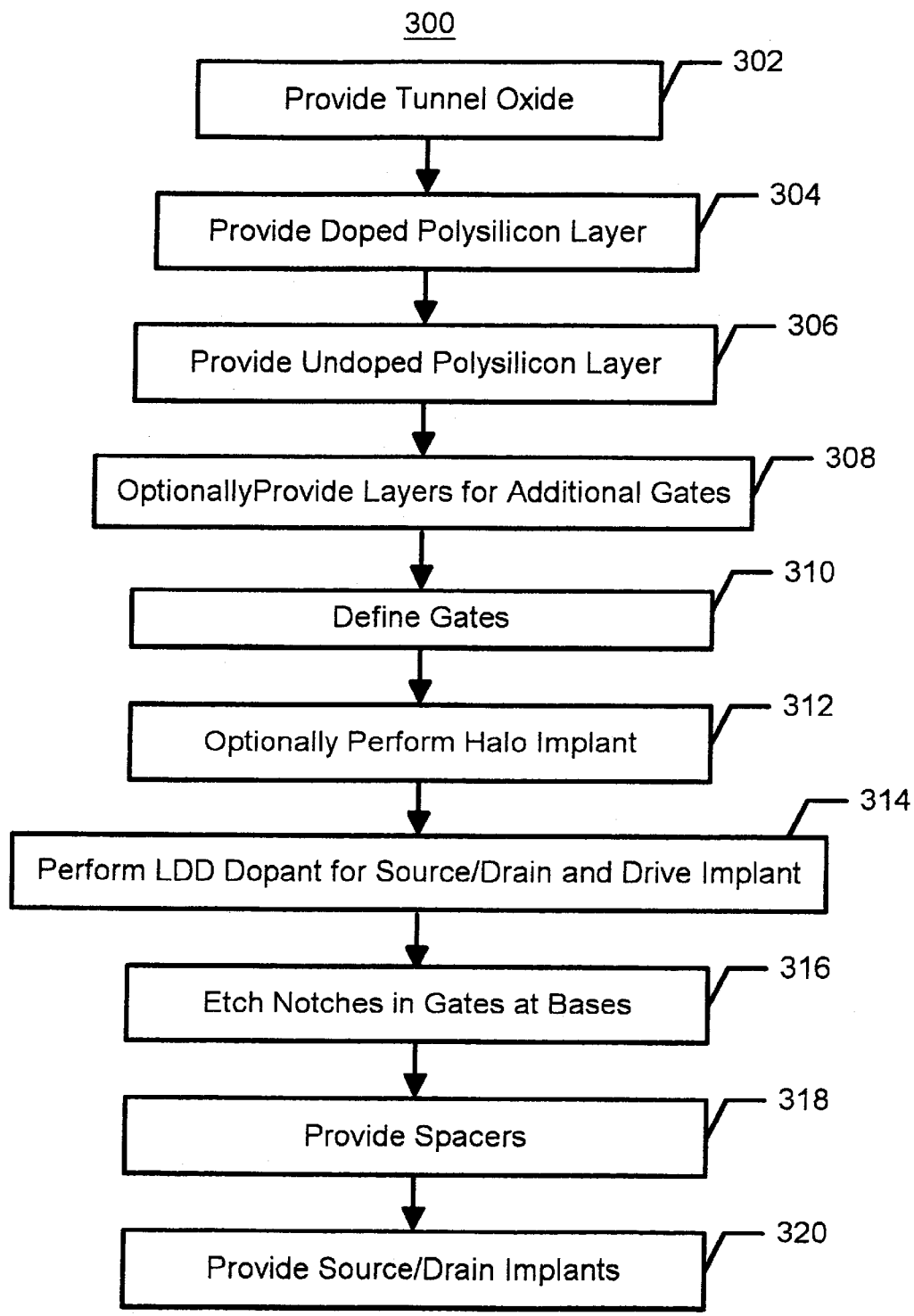
FIG. 8A is a more detailed flow chart of the second embodiment of the method in accordance the present invention.

FIG. 8A depicts a more detailed flow chart of a third version of the second embodiment of a method 300 in accordance with the present invention. FIGS. 8B–8E depict a semiconductor device 330 in accordance with the present invention. The semiconductor device is preferably a bulk device, such as a FET formed on the bulk semiconductor. However, in another embodiment, the semiconductor device could be another device, such as an SOI device. The tunneling barrier is provided, via step 302. The tunneling barrier is a thin insulator, often approximately one hundred Angstroms or less in thickness. In one embodiment, the tunneling barrier includes NO or $N_2O$. A layer of doped polysilicon is provided on the tunnel barrier, via step 304. A layer of undoped polysilicon is provided on the doped polysilicon, the step 306. The combination of the undoped polysilicon and the doped polysilicon will form the first gate for the cells in the semiconductor device being fabricated. The layers for subsequent gates, if any, are provided, via step 308. Step 308, if performed for subsequent gates, would include separating gates in a single cell by an insulating layer.

Figure 8B:
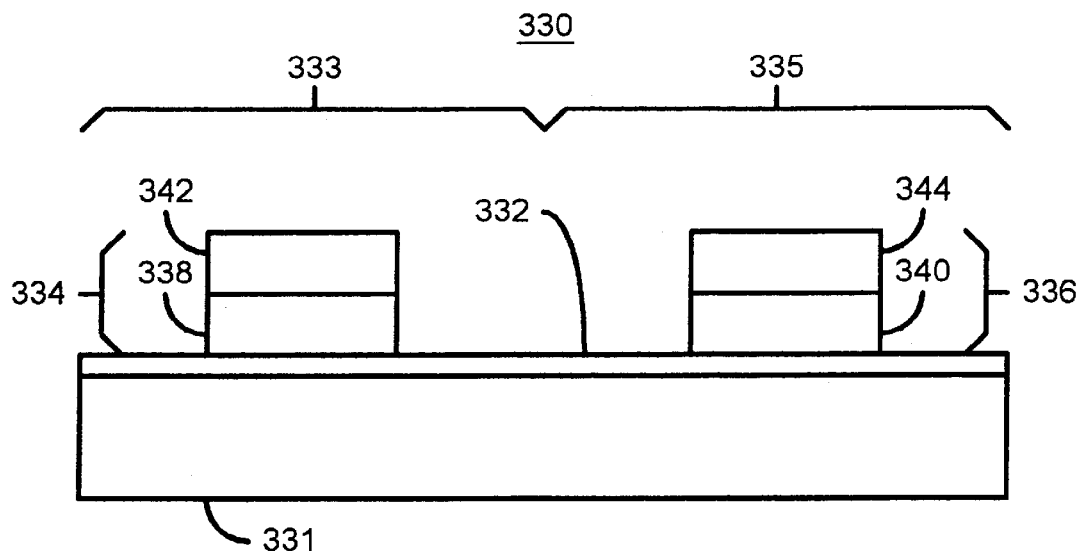
FIGS. 8B–8E depict a fourth embodiment of the semiconductor device in accordance with the present invention.
Figure 8C:
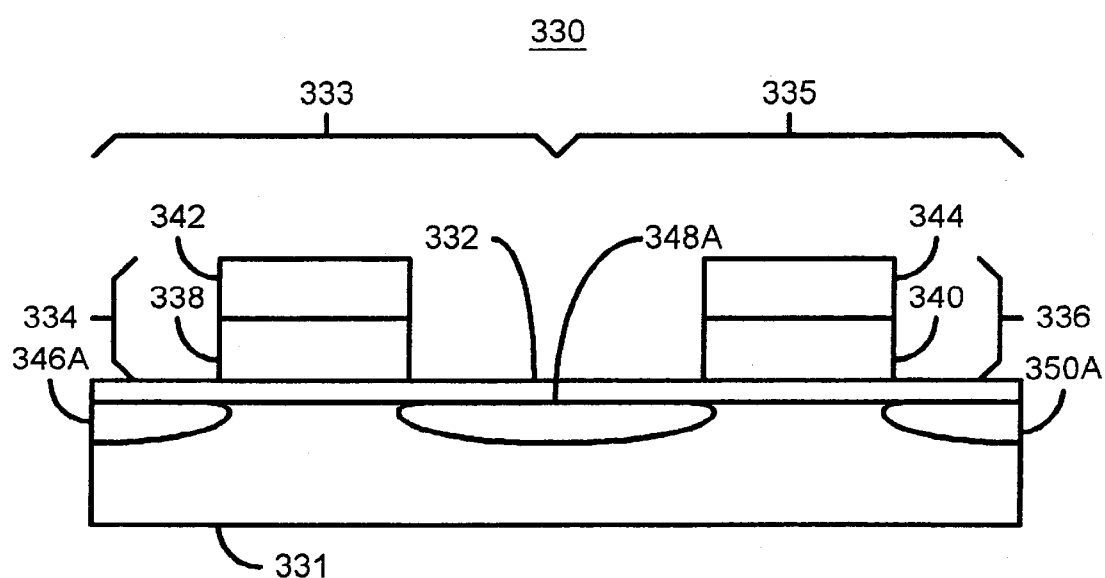

The gates for the memory cells are then defined, via step 310. Step 310 generally includes providing a layer photoresist on the semiconductor device, transferring a pattern to the layer photoresist, and etching to be exposed portions of the polysilicon layer(s). FIG. 8B depicts the semiconductor device 330 after step 310 has been performed. The semiconductor device 330 includes a substrate 331 and tunneling barrier 332. The semiconductor device 330 includes cells 333 and 335 having gates 334 and 336. The gates 334 and 336 include doped polysilicon layers 338 and 340, respectively. The gates 334 and 336 also include undoped polysilicon layers 342 and 344, respectively.

Referring back to FIG. 8A, an optional halo implant can be provided, via step 312. The dopant for the halo implant provided in step 312 has the same conductivity type as the channel and, therefore, the opposite conductivity type to the source and drain. A first source and/or drain implant is also provided, via step 314. The first source and/or drain implant is preferably an LDD implant. Step 314 could also include driving the dopant for the first source and/or drain implant. FIG. 6C depicts the semiconductor device 330 after the step 314 has been performed. The semiconductor device 330 includes source regions 346A and 350A and drain region 348A, all of which are preferably relatively shallow. The source regions 346A and 350A and drain region 348A were provided in the step 314. Not depicted are the implants provided by the halo implant step 312.

Figure 8D:
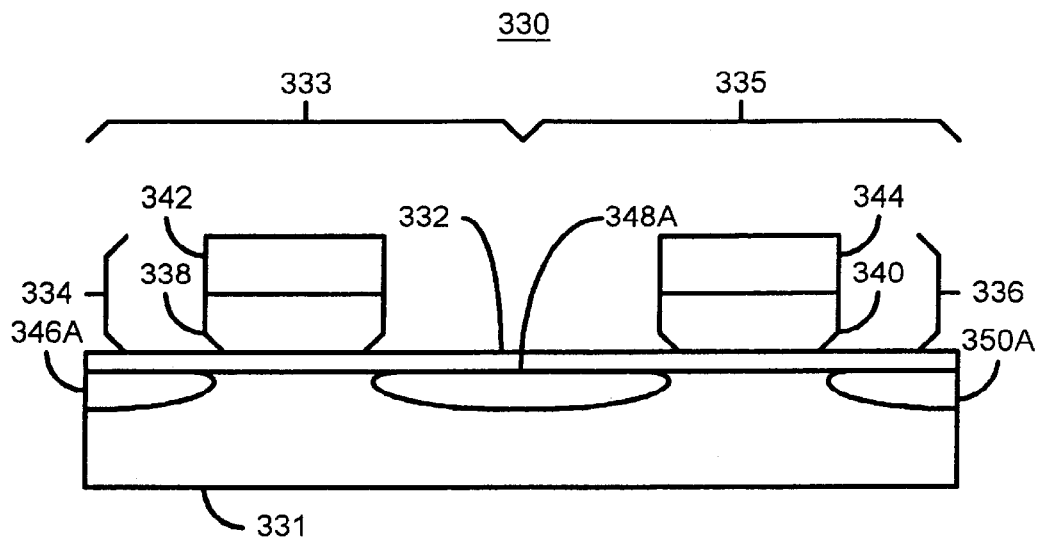

Referring back to FIG. 8A, notches are etched in the lower corners of the gates, via step 316. In a preferred embodiment, the etch performed is an isotropic wet chemical etch. The gates can be notched because doped polysilicon can etch more rapidly than undoped polysilicon. Thus, the etch provided etches the edges of the doped polysilicon layer faster than the undoped polysilicon. In addition, damage caused by the implanting steps 312 and 314 may cause the lower corners of the gates 334 and 336 to be etched more rapidly. Consequently, notches can be formed in the lower corners of the polysilicon layer. FIG. 8D depicts the semiconductor device 330 after step 316 has been performed. As can be seen in FIG. 8D, notches have developed in the lower layer of doped polysilicon 338 and 340 in gates 334 and 336. The bases of the gates 334 and 336 are the portions of the gates 334 and 336 still in contact with the tunneling barrier 332. Because of the notches provided in step 316, the bases of the gates 334 and 336 are smaller than the remainder of the gates 334 and 336. Because the gates 334 and 336 have been notched, the source regions 346A and 350A and the drain region 348A all do not extend under the bases of the gates 334 and 336.

Referring back to FIG. 8A, spacers are provided, via step 318. The spacers provided in step 318 are approximately five hundred to one thousand Angstroms in thickness. Thus, these spacers are analogous to the conventional spacers described in FIGS. 1 and 2A–2C. The source and/or drain implant is then provided, via step 320. The source and/or drain implant provided in step 320 is generally arsenic. The dopant provided in step 320 results in portions of the source and/or drain that are deeper than the portions of the source and/or drain provided in the first source and/or drain implant of step 320. Fabrication of the semiconductor device can then be completed in a conventional manner.

Figure 8E:
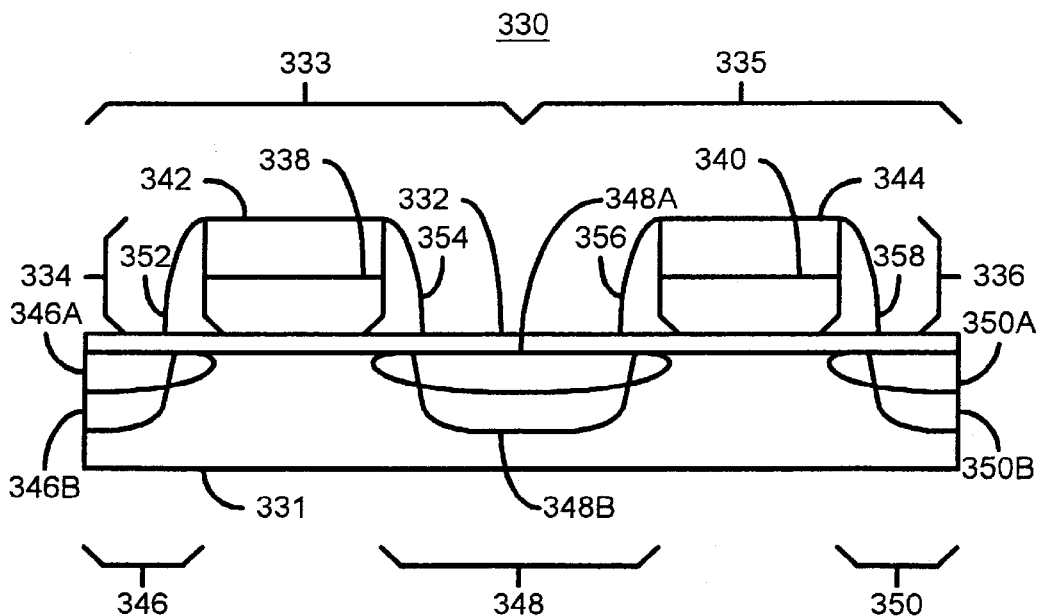

FIG. 8E depicts the semiconductor device 330 after the source and/or drain implant has been performed in step 320. The spacers 352, 354, 356 and 358 have been created. The source regions 346B and 350B, as well as drain region 348B have also been formed. These regions 346B, 348B and 350B are deeper than the extensions 346A, 348A and 350A, respectively. Because of the presence of the spacers 352, 354, 356 and 358, the source regions 346B and 350B and drain region 348B are both far from the edges of the gates 334 and 336. Thus, the notches provided in the gates 334 and 336 ensure that substantially no portion of the sources 456 and 350 substantially no portion of the drain 348 extend under the bases of the gates 334 and 336. There is, therefore, substantially no spatial overlap between the sources 346 and 350 and the bases of the gates 334 and 336 and substantially no spatial overlap between the drain 348 and the bases of the gates 334 and 336.

Because substantially no spatial overlap between the gates 334 and 336 and the sources 346 and 350 or the drain 348, the power dissipated by the semiconductor device 330 is reduced. As discussed above, a portion of the off-state leakage current is proportional to the spatial overlap between the sources 346 and 350 and/or the drain 348 and the gates 334 and 336. Because there is essentially no spatial overlap, this off-state leakage current is reduced. As a result, the power dissipated while the semiconductor device 333 is off can be reduced. Furthermore, because there is no spatial overlap, the hot carrier injection stress is reduced. As a result, the tunneling barrier 332 is not degraded due to hot carrier injection. In addition, any RC delay can be reduced. Because there is no spatial overlap, there is no capacitance due to the overlap. Consequently, there is reduced capacitive delay and improved speed for the semiconductor device 240. In addition, because there is less of a spatial overlap, the band-to-band tunneling and gate induced leakage current are reduced. As a result, performance of the semiconductor device 240 is improved.

A method and system has been disclosed for providing a semiconductor device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device on a substrate comprising:
   at least one gate, at least the one gate including a first edge and a second edge and a base;
   a tunneling barrier disposed along the base of at least the one gate, between the substrate and at least the one gate; and
   a source for at least the one gate, the source being along to the first edge of at least the one gate, at least the one gate, the source or both being configured such that the source does not substantially overlap at least the one gate at the base of at least the one gate;
   wherein the source includes at least one dopant and wherein during fabrication, semiconductor device further comprises:
      a doping spacer for at least the one gate, the doping spacer along at least the first edge of at least the one gate, the doping spacer having a width, the width being sufficiently large to prevent at least the one dopant for the source from overlapping at least the one gate at the base of at least the one gate when at least the one dopant is provided after the doping spacer.

2. The semiconductor device of claim 1 further comprising:
   a drain for at least the one gate, the drain being along the second edge of at least the one gate, at least the one gate, the drain or both being configured such that the drain does not substantially overlap at least the gate at the base of at least the one gate.

3. The semiconductor device of claim 1 further comprising:
   a drain for at least the one gate, the drain being along the second edge of at least the one gate and not substantially overlapping at least the one gate at the base of at least the one gate, the drain including at least a second dopant; and
   a second doping spacer along the second edge of at least the one gate, the second doping spacer having a second width, the second width being sufficiently large to prevent the drain from substantially overlapping at least the one gate at the base of at least the one gate when at least the second dopant is provided after the second doping spacer.

4. The semiconductor device of claim 3 wherein the width and the second width are substantially the same.

5. The semiconductor device of claim 1 wherein at least the one doping further includes an LDD doping.

6. The semiconductor device of claim 1 further comprising:
   a plurality of spacers for at least the one gate, the plurality of spacers having a second thickness greater than the width of the doping spacer and being along at least a portion of the first edge and the second edge of at least the one gate.

7. The semiconductor device of claim 6 wherein a portion of the plurality of spacers is provided on the doping spacer.

8. A semiconductor device on a substrate comprising:
   at least one gate, at least the one gate including a first edge and a second edge and a base;
   a tunneling barrier disposed along the base of at least the one gate, between the substrate and at least the one gate; and
   a source for at least the one gate, the source being along the first edge of at least the one gate, at least the one gate, the source or both being configured such that the source does not substantially overlap at least the one gate at the base of at least the one gate;
   wherein the source includes at least one dopant; wherein at least the one gate further includes a first gate having the first edge, the first gate including a notch in the first edge, the notch having a width, the width being sufficiently large to prevent at least the one dopant from overlapping at least the gate at the base of at least the one gate, the notch occupying only a portion of the first edge such that the first edge has a first slope for the notch and a second slope for a remaining portion of the first edge not including the notch.

9. The semiconductor device of claim 8 wherein the notch is provided using a reverse slope etch.

10. The semiconductor device of claim 9 wherein at least the one gate further includes a second notch in the second edge and wherein the semiconductor device further comprises:
    a drain disposed along the second edge of at least the one gate, the notch having a second width that is sufficiently large to prevent the drain from substantially overlapping at least the one gate at the base of at least the one gate.

11. The semiconductor device of claim 8 wherein at least the one gate further includes the first gate including a doped polysilicon layer and a second gate including a polysilicon layer on the doped polysilicon layer, and wherein the notch is provided in an etch that etches the layer of undoped polysilicon and more slowly than the layer of doped polysilicon, the first slope being for a portion of the doped polysilicon having the notch and the second slope being for the undoped polysilicon.

12. The semiconductor device of claim 8 wherein the semiconductor device is a bulk device.

13. The semiconductor device of claim 8 wherein the semiconductor device is a silicon oxide insulator device.

14. A semiconductor device on a substrate comprising:
    at least one gate, at least the one gate including a first edge and a second edge and a base;
    a tunneling barrier disposed along the base of at least the one gate, between the substrate and the at least one gate;
    a drain for at least the one gate, the drain being along the first edge of at least the one gate, at least the one gate, the drain or both being configured such that the drain does not substantially overlap at least the one gate at the base of at least the one gate, the drain including at least one dopant; and
    a doping spacer for at least the one gate provided during fabrication of the semiconductor device, the doping spacer along at least the first edge of at least the one gate, the doping spacer having a width, the width being sufficiently large to prevent at least the one dopant for the drain from overlapping at least the one gate at the base of at least the one gate when the dopant is provided after the doping spacer.

15. The semiconductor device of claim 14 wherein the drain includes at least a second dopant, wherein at least the one gate further includes a notch in the first edge, the notch having a width, the width being sufficiently large to prevent at least the second dopant from overlapping at least the one gate at the base of at least the one gate.

* * * * *

UNITED STATES PATENT AND TRADEMARK OFFICE
CERTIFICATE OF CORRECTION

PATENT NO. : 6,646,326 B1
DATED : November 11, 2003
INVENTOR(S) : Hyeon-Seag Kim and Jongwook Kye It is certified that error appears in the above-identified patent and that said Letters Patent is hereby corrected as shown below:

<u>Column 14,</u>
Line 18, please replace "9" with -- 8 --.

Signed and Sealed this

Eighteenth Day of May, 2004

JON W. DUDAS
*Acting Director of the United States Patent and Trademark Office*